United States Patent
Hu (10) Patent No.: US 9,793,229 B1
(45) Date of Patent: Oct. 17, 2017

(54) INSULATING PROTRUSION IN THE TRENCH OF A RE-DISTRIBUTION LAYER STRUCTURE

(71) Applicant: ChipMOS Technologies Inc., Hsinchu (TW)

(72) Inventor: En-Sung Hu, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 15/455,138

(22) Filed: Mar. 10, 2017

(30) Foreign Application Priority Data

Nov. 23, 2016 (TW) .............................. 105138518 A (51) Int. Cl.
*H01L 23/12* (2006.01)
*H01L 21/00* (2006.01)
(Continued)

(52) U.S. Cl.
CPC .......... *H01L 24/05* (2013.01); *H01L 21/4846* (2013.01); *H01L 21/76802* (2013.01); *H01L 21/76877* (2013.01); *H01L 21/76898* (2013.01); *H01L 23/481* (2013.01); *H01L 24/03* (2013.01); *H01L 24/11* (2013.01); *H01L 24/19* (2013.01); *H01L 2224/0233* (2013.01); *H01L 2224/0235* (2013.01); *H01L 2224/02206* (2013.01); *H01L 2224/02317* (2013.01); *H01L 2224/0401* (2013.01); *H01L 2224/04042* (2013.01); *H01L 2224/05027* (2013.01); *H01L 2224/4805* (2013.01)

(58) Field of Classification Search
CPC ......... H01L 24/05; H01L 24/03; H01L 24/11; H01L 24/19; H01L 23/481; H01L 21/76898; H01L 21/76877; H01L 21/76802; H01L 21/4846
See application file for complete search history.

(56) References Cited

U.S. PATENT DOCUMENTS 7,408,260 B2 * 8/2008 Fjelstad .............. H01L 23/3114
257/642
7,432,192 B2 * 10/2008 Feng ................. H01L 21/76877
257/751

(Continued)

*Primary Examiner* — Alonzo Chambliss
(74) *Attorney, Agent, or Firm* — Jianq Chyun IP Office (57) ABSTRACT

A re-distribution layer structure is adapted to be disposed on a substrate having a pad and a protective layer which has a first opening exposing a part of the pad. The re-distribution layer structure includes a first and a second patterned insulating layers and a re-distribution layer. The first patterned insulating layer is disposed on the protective layer and includes at least one protrusion and a second opening corresponding to the first opening. The re-distribution layer is disposed on the first patterned insulating layer and includes a pad portion and a wire portion. The pad portion is located on the first patterned insulating layer. The wire portion includes a body and at least one trench caved in the body. The body extends from the pad portion to the pad exposed by the first and the second openings. The body covers the protrusion, and the at least one protrusion extends into the at least one trench. The second patterned insulating layer covers the wire portion and exposes a part of the pad portion. A manufacturing method of re-distribution layer structure is further provided.

10 Claims, 7 Drawing Sheets (51) Int. Cl.
*H01L 23/00* (2006.01)
*H01L 21/768* (2006.01)
*H01L 21/48* (2006.01)
*H01L 23/48* (2006.01)

(56) References Cited

U.S. PATENT DOCUMENTS

| | | | | |
|---|---|---|---|---|
| 7,986,046 B2* | 7/2011 | Narita | ............... | H01L 24/16 257/737 |
| 8,288,865 B2* | 10/2012 | Suzuki | ............ | H01L 23/3114 257/737 |
| 2006/0103020 A1 | 5/2006 | Tong et al. | | |

* cited by examiner

INSULATING PROTRUSION IN THE TRENCH OF A RE-DISTRIBUTION LAYER STRUCTURE

CROSS-REFERENCE TO RELATED APPLICATION

This application claims the priority benefit of Taiwan application serial no. 105138518, filed on Nov. 23, 2016. The entirety of the above-mentioned patent application is hereby incorporated by reference herein and made a part of this specification.

BACKGROUND OF THE INVENTION

1. Field of the Invention

The invention generally relates to a circuit structure and a manufacturing method thereof, and more particularly, to a re-distribution layer structure and a manufacturing method thereof.

2. Description of Related Art

In modern time, the multimedia application market is expanding quickly. The packaging technique of integrated circuits must be developed to meet the development of such electronic devices. In order to achieve the above requirements, it is necessary to strengthen the features of high-speed processing, multifunction, integration, small scale and light-weight, low price, etc. of the electronic devices. Accordingly, the development of the packaging technique of integrated circuits also tends towards minimization and high density of the size. The packaging density of an integrated circuit refers to the number of pins in a unit area. For a high-density integrated circuit package, reduction of the wire length between the integrated circuit and the package substrate benefits the speed of signal transmissions. Therefore, the flip-chip package technique using routes for transmitting signals has become the mainstream technique in the high-density package.

Soldering pads on a flip-chip are usually arranged in an array, and positions of the soldering pads of the flip-chip do not necessarily correspond to positions of the pads on a substrate. Currently, a re-distribution layer is used for re-distributing of the pads on the substrate into an arrangement corresponding to the array distribution of the soldering pads of the flip-chip. Therefore, the solder pads of the flip-chip can be electrically connected with the pads on the substrate through bumps and the re-distribution layer.

As the wire width of the current re-distribution layer becoming smaller and smaller, in order for the wire to have a certain resistance, the usual way is to increase the wire thickness so as to enable the wire to be maintained with a certain cross-sectional area. This also causes the cross-section of the wire to be resulted in a high and narrow shape. However, the thin and narrow type wire also reduces an area for adhesion between itself and the underlying substrate or between itself and an insulating layer on the substrate, and thus is prone to be dumped and thereby results in peeling.

SUMMARY OF THE INVENTION

The invention is directed to a re-distribution layer structure, which is difficult to be peeled and has a favorable structure stability.

The invention is directed to a manufacturing method of re-distribution layer structure, which can manufacture the aforesaid re-distribution layer structure.

A re-distribution layer structure of the invention is disposed on a substrate, and the substrate has a pad and a protective layer, wherein the protective layer has a first opening, and the first opening exposes a part of the pad. The re-distribution layer structure includes a first patterned insulating layer, a re-distribution layer and a second patterned insulating layer. The first patterned insulating layer is disposed on the protective layer and includes a second opening and at least one protrusion, wherein the second opening is corresponded to the first opening so as to expose a part of the pad, and the at least one protrusion protrudes toward a direction away from the protective layer. The re-distribution layer is disposed on the first patterned insulating layer and includes a pad portion and a wire portion, wherein the pad portion is located on the first patterned insulating layer, the wire portion includes a body and at least one trench caved in the body, and the wire portion is located on the first patterned insulating layer and extends from the pad portion into the first opening and the second opening so as to be connected with the pad, the at least one protrusion extends into the at least one trench, and the body covers the at least one protrusion. The second patterned insulating layer is disposed on the first patterned insulating layer, and the second patterned insulating layer covers the wire portion and exposes a part of the pad portion.

In one embodiment of the invention, the at least one protrusion includes a strip-shaped protrusion or a plurality of separated pile-shaped protrusions, and the at least one trench includes a strip-shaped trench or a plurality of separated trenches.

In one embodiment of the invention, an inner profile shape of the at least one trench is corresponded to an outer profile shape of the protrusion, and the number and position of the at least one protrusion are corresponded to the number and position of the at least one trench.

In one embodiment of the invention, a width of the at least one protrusion gradually shrinks, gradually expands or remain unchanged following a direction away from the protective layer.

In one embodiment of the invention, a width of the at least one protrusion is smaller than a width of the body.

In one embodiment of the invention, the body of the wire portion includes a plurality of enlarged regions and a plurality of connection regions, which are alternately connected, along an extending direction of the wire portion, widths of the enlarged regions are respectively greater than widths of the connection regions, and a shape of the enlarged regions includes circle, oval, rectangle, diamond, or irregular shape.

In one embodiment of the invention, the re-distribution layer structure further includes an under bump metallurgic (UBM) layer, disposed under the re-distribution layer and located between the re-distribution layer and the first patterned insulating layer and between the re-distribution layer and the pad.

In one embodiment of the invention, the re-distribution layer structure further includes a patterned metal composite layer, disposed on the re-distribution layer, and a width of the patterned metal composite layer is greater than a width of the re-distribution layer.

A manufacturing method of re-distribution layer structure of the invention includes: providing a substrate, wherein the substrate has a pad and a protective layer, the protective layer has a first opening, and the first opening exposes a part of the pad; forming a first insulating layer on the protective layer; performing twice a patterning procedure on the first insulating layer to form a first patterned insulating layer, wherein the first patterned insulating layer includes a second opening and at least one protrusion, the second opening is corresponded to the first opening so as to expose a part of the pad, and the at least one protrusion protrudes toward a direction away from the protective layer; forming a re-distribution layer on the first patterned insulating layer, wherein the re-distribution layer includes a pad portion and a wire portion, the pad portion is located on the first patterned insulating layer, the wire portion includes a body and at least one trench caved in the body, the wire portion is located on the first patterned insulating layer and extends from the pad portion into the first opening and the second opening so as to be connected with the pad, the at least one protrusion extends into the at least one trench, and the body covers the at least one protrusion; and forming a second patterned insulating layer on the first patterned insulating layer to cover the wire portion and a periphery of the pad portion, and the second patterned insulating layer exposing a part of the pad portion.

In one embodiment of the invention, the manufacturing method of re-distribution layer structure further includes: before forming the re-distribution layer, forming an UBM layer on the first patterned insulating layer, wherein the UBM layer covers the pad and a part of the first patterned insulating layer.

In view of the above, the re-distribution layer structure of the invention, through configuring the first patterned insulating layer with the protrusion, enabling the wire portion of the re-distribution layer to include the body and the trench caved in the body, and effectively increasing an area for adhesion between the first patterned insulating layer and the wire portion of the re-distribution layer by extending the protrusion of the first patterned insulating layer into the trench of the wire portion so as to lower a probability of which the wiring portion of the re-distribution layer is peeled off from the first patterned insulating layer, enables the wire portion of the re-distribution layer to have a favorable structure stability on the substrate.

In order to the make aforementioned and other objects, features and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
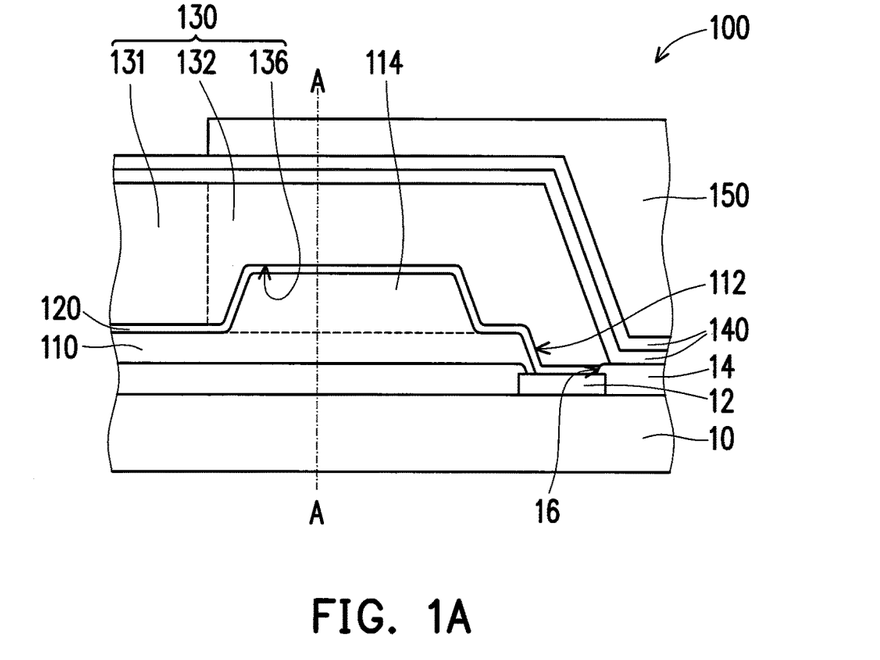
FIG. 1A is a schematic partial cross-sectional view illustrating a re-distribution layer structure according to an embedment of the invention.

FIG. 1A is a schematic partial cross-sectional view illustrating a re-distribution layer structure according to an embedment of the invention. Referring to FIG. 1A, in the present embodiment, a re-distribution layer structure 100 adapted to be disposed on a substrate 10 to re-distribute a pad 12 of the substrate 10 to other position. In the present embodiment, the substrate 10 may be a circuit board, a wafer or a chip, and the type of the substrate 10 is not limited thereto. As shown in FIG. 1A, the substrate 10 has a pad 12 and a protective layer 14, wherein the protective layer 14 has a first opening 16, and the first opening 16 exposes a part of the pad 12.

The re-distribution layer structure 100 includes a first patterned insulating layer 110, a re-distribution layer 130 and a second patterned insulating layer 150. The first patterned insulating layer 110 is disposed on the protective layer 14 and includes a second opening 112, wherein the second opening 112 is corresponded to the first opening 16 so as to expose a part of the pad 12.

The re-distribution layer 130 is disposed on the first patterned insulating layer 110 and includes a pad portion 131 and a wire portion 132. As shown in FIG. 1A, the wire portion 132 extends from the pad portion 131 at the left side, towards the right side, and into the first opening 16 and the second opening 112 so as to be connected with the pad 12. In the present embodiment, the pad 12 on the substrate 10 can be re-distributed to a position of the pad portion 131 through the wire portion 132, so as to facilitate subsequent connection with other circuit structure (not shown). A material of the re-distribution layer 130 includes copper, but is not limited thereto.

In general, a resistance of a wire is related to its cross-sectional area, such that the larger the cross-sectional area, the lower the resistance. As current circuits developing towards a direction of thin wiring, in conventional re-distribution layer, a resistance change due to a width reduction of the wire is compensated by increasing a thickness of the wire; however, such design causes a cross-section of the wire to show a high and narrow shape, thereby reducing an area for adhesion between the wire and the underlying substrate, and thus is prone to an occurrence of dumping or peeling. The re-distribution layer structure 100 of the present embodiment, with the following design, can effectively lower the occurrence of which the re-distribution layer 130 is dumped or peeled off.

Figure 1B:
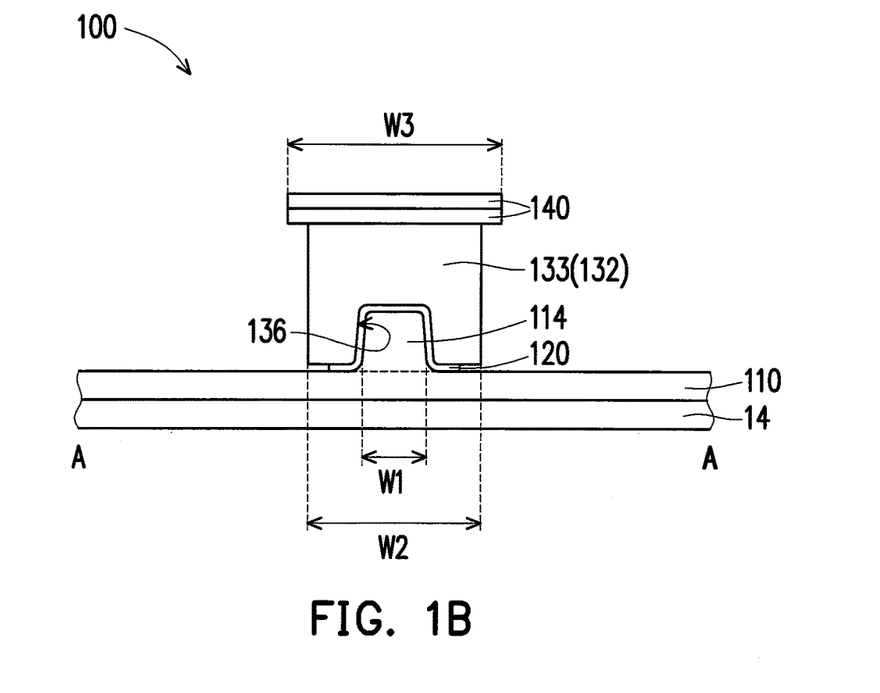
FIG. 1B is a schematic cross-sectional view illustrating the re-distribution layer structure of FIG. 1A along a line segment A-A with a substrate and a second patterned insulating layer hidden.
Figure 1C:
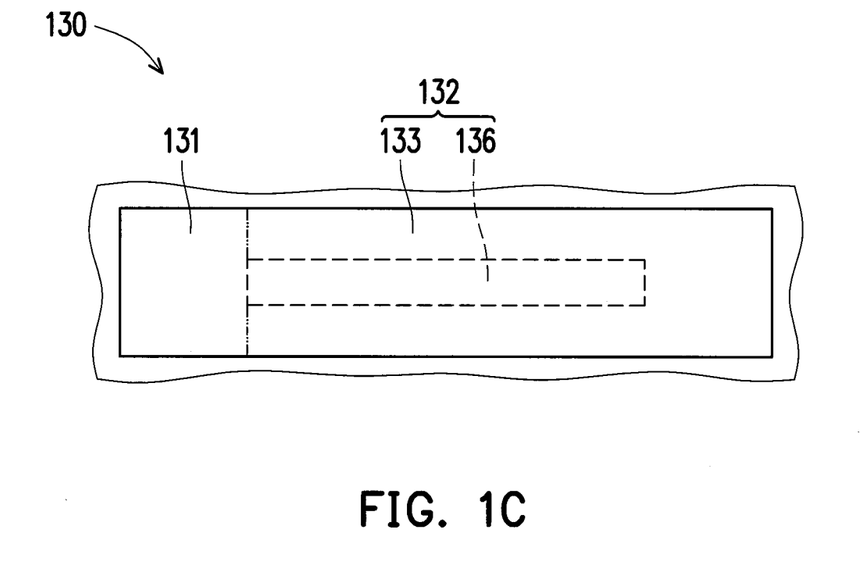
FIG. 1C is a schematic top view of a re-distribution layer of the re-distribution layer structure of FIG. 1A.

FIG. 1B is a schematic cross-sectional view illustrating the re-distribution layer structure of FIG. 1A along a line segment A-A with the substrate and the second patterned insulating layer hidden. FIG. 1C is a schematic top view of the re-distribution layer of the re-distribution layer structure of FIG. 1A. Referring to FIG. 1A through FIG. 1C at the same time, in the present embodiment, the first patterned insulating layer 110 further includes at least one protrusion 114. The protrusion 114 protrudes toward a direction away from the protective layer 14 (namely, the upper side of FIG. 1B).

As shown in FIG. 1B, the wire portion 132 includes a body 133 and at least one trench 136 caved in the body 133. In the present embodiment, the protrusion 114 is a single strip-shaped protrusion, trench 136 is a single strip-shaped trench, and a position of the protrusion 114 is corresponded to a position of the trench 136. An outer profile shape of the protrusion 114 is corresponded to an inner profile shape of the trench 136. The protrusion 114 of the first patterned insulating layer 110 extends into and fills up the trench 136 of the wire portion 132.

In the present embodiment, the re-distribution layer structure 100, through forming the protrusion 114 at the first patterned insulating layer 110, enabling the wire portion 132 of the re-distribution layer 130 to include the trench 136 caved in the body 133, and increasing an area for adhesion between the first patterned insulating layer 110 and the wire portion 132 of the re-distribution layer 130 by extending the protrusion 114 of the first patterned insulating layer 110 into the trench 136 of the of the wire portion 132 of the re-distribution layer 130, with such design, enables an adhesion state between the wire portion 132 and the underlying first patterned insulating layer 110 to change from the conventionally known plane into a three-dimensional structure. Since the area for adhesion between the wire portion 132 and the underlying first patterned insulating layer 110 is increased, a probability of which the wire portion 132 of the re-distribution layer 130 is peeled off from the first patterned insulating layer 110 can effectively be lowered, thereby enabling the wire portion 132 of the re-distribution layer 130 to have a favorable structure stability on the substrate 10. Moreover, with such design, the wire portion 132 having a thin wire width is also not required to intentionally increase a thickness of thereof so as to lower its resistance.

Moreover, in the present embodiment, the re-distribution layer structure 100 further includes an under bump metallurgic (UBM) layer 120 and a patterned metal composite layer 140. The UBM layer 120 is disposed under the re-distribution layer 130, and located between the re-distribution layer 130 and the first patterned insulating layer 110 and between the re-distribution layer 130 and the pad 12 so as to serve as an bonding medium between the first patterned insulating layer 110 and the re-distribution layer 130 disposed thereon and between the pad 12 and the re-distribution layer 130 disposed thereon, thereby increasing adhesions between the first patterned insulating layer 110 and the re-distribution layer 130 and between the pad 12 and the re-distribution layer 130. The UBM layer 120 includes a composite metal layer made of an adhesive layer, a barrier layer, a wetting layer and so forth.

The patterned metal composite layer 140 is disposed on the re-distribution layer 130. As shown in FIG. 1B, a width W3 of the patterned metal composite layer 140 is greater than a width W2 of the body 133 of the re-distribution layer 130, and the width W2 of the body 133 is greater than a width W1 of the protrusion 114. In the present embodiment, the patterned metal composite layer 140 is, for example, a nickel layer disposed on the re-distribution layer 130 and a gold layer disposed on the nickel layer, but the type of the patterned metal composite layer 140 is not limited thereto.

The second patterned insulating layer 150 is disposed above the first patterned insulating layer 110 and the re-distribution layer 130. As shown in FIG. 1A, the second patterned insulating layer 150 covers the wire portion 132 and exposes a part of the pad portion 131. A bump (not shown) can be connected to the pad portion 131 through the patterned metal composite layer 140 above the pad portion 131.

Figure 1D:
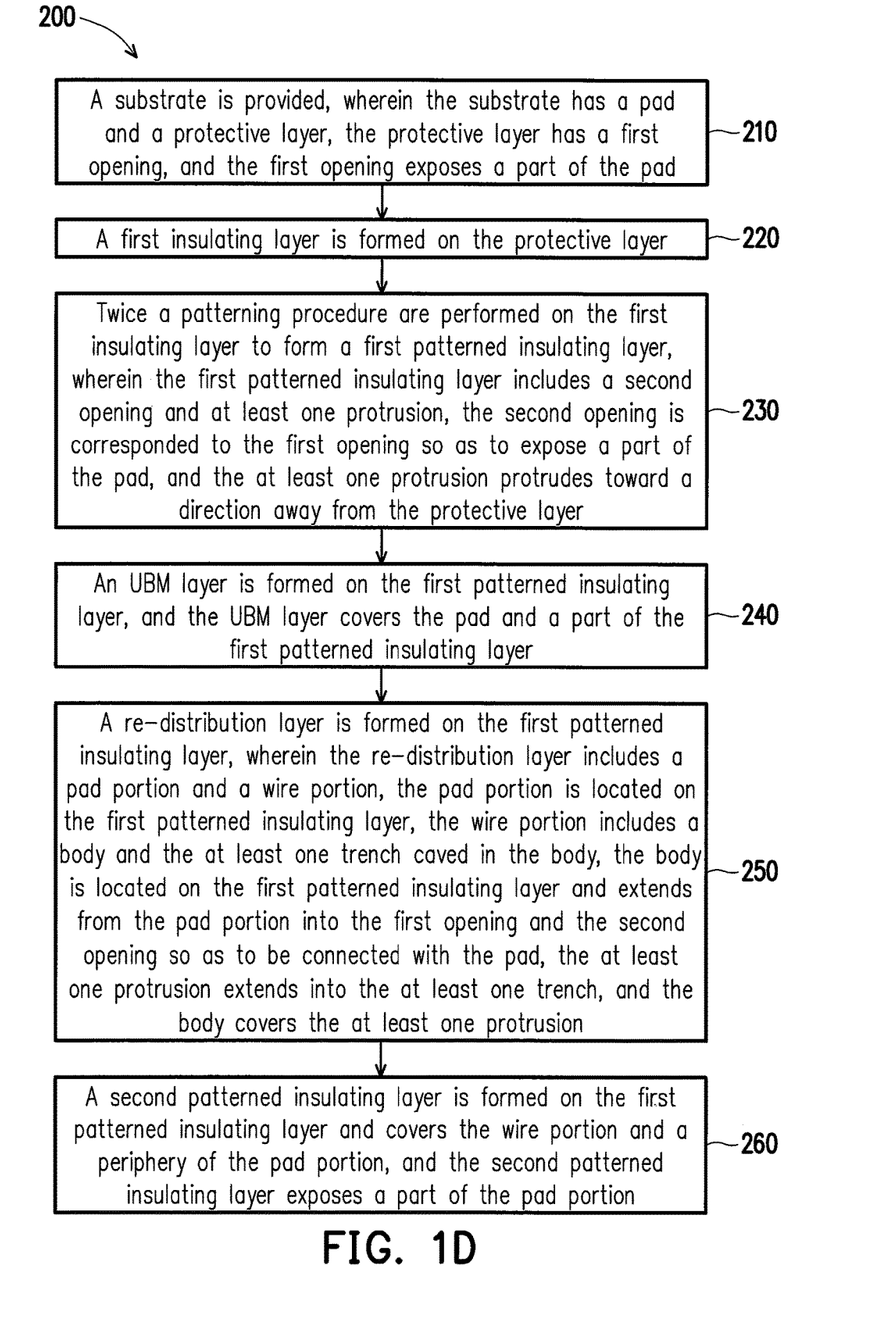
FIG. 1D is a schematic flow chart illustrating steps of a manufacturing method of re-distribution layer structure according to an embedment of the invention.

FIG. 1D is a schematic flow chart illustrating steps of a manufacturing method of re-distribution layer structure according to an embedment of the invention. The manufacturing method of re-distribution layer structure 200 of the present embodiment can manufacture the re-distribution layer structure 100 as shown in FIG. 1A. Referring to FIG. 1A and FIG. 1D at the same time, the manufacturing method of re-distribution layer structure 200 includes the following steps.

Firstly, in step 210, a substrate 10 is provided, wherein the substrate 10 has a pad 12 and a protective layer 14, the protective layer 14 has a first opening 16, and the first opening 16 exposes a part of the pad 12. The substrate 10 may be a circuit board, a wafer or a chip, and the type of the substrate 10 is not limited thereto. In the present embodiment, a material of the pad 12 is, for example, aluminum. A material of the protective layer 14 may include silicon oxide, silicon oxynitride, silicon nitride, organic material, polymers, or a combination thereof. The organic material is, for example, benzocyclobutene (BCB). The polymer is, for example, polyimide (PI). The protective layer 14 may be formed by using a chemical vapor deposition method or a coating method, but not limited thereto.

Next, in step 220, a first insulating layer is formed on the protective layer 14. A material of the first insulating layer may include silicon oxide, silicon oxynitride, silicon nitride, organic material, polymers, or a combination thereof. The organic material is, for example, benzocyclobutene (BCB). The polymer is, for example, polyimide (PI). The first insulating layer may be formed by using the chemical vapor deposition method or the coating method, but not limited thereto. In addition, the material of the first insulating layer can be the same or different from that of the protective layer 14.

Further, in step 230, twice a patterning procedure are performed on the first insulating layer to form a first patterned insulating layer 110, wherein the first patterned insulating layer 110 includes a second opening 112 and at least one protrusion 114, the second opening 112 is corresponded to the first opening 16 so as to expose a part of the pad 12, and the at least one protrusion 114 protrudes toward a direction away from the protective layer 14. In the step 230, with a characteristic of a positive type photoresist in which it will be removed after underwent an exposure development, the protrusion 114 being thicker the other parts of the first patterned insulating layer 110 and the second opening 112 penetrating through the first patterned insulating layer 110 are produced by performing twice the patterning procedure on the first insulating layer.

Next, in step 240, an UBM layer 120 is formed on the first patterned insulating layer 110, and the UBM layer 120 covers the pad 12 and a part of the first patterned insulating layer 110. In the present embodiment, a method of forming the UBM layer 120 on the first patterned insulating layer 110 includes sputtering. The UBM layer 120 includes a composite metal layer made of an adhesive layer, a barrier layer, a wetting layer, and so forth.

Further, in step 250, a re-distribution layer 130 is formed on the first patterned insulating layer 110, wherein the re-distribution layer 130 includes a pad portion 131 and a wire portion 132, the pad portion 131 is located on the first patterned insulating layer 110, the wire portion 132 includes a body 133 and the at least one trench 136 caved in the body 133, the body 133 is located on the first patterned insulating layer 110 and extends from the pad portion 131 into the first opening 16 and the second opening 112 so as to be connected with the pad 12, the at least one protrusion 114 extends into the at least one trench 136, and the body 133 covers the at least one protrusion 114.

In the present embodiment, the re-distribution layer 130 is formed on the first patterned insulating layer 110 by using a method of electroplating, but the method of forming the re-distribution layer 130 is not limited thereto. Moreover, in the present embodiment, a material of the re-distribution layer 130 includes copper, but the material of the re-distribution layer 130 may also be other metal, and is not limited thereto. Afterwards, a patterned metal composite layer 140 can be formed on the re-distribution layer 130, and the patterned metal composite layer 140 may include a nickel layer and a gold layer disposed on the nickel layer, but the type of the patterned metal composite layer 140 is not limited thereto.

Finally, in step 260, a second patterned insulating layer 150 is formed on the first patterned insulating layer 110 and covers the wire portion 132 and a periphery of the pad portion 131, and the second patterned insulating layer 150 exposes a part of the pad portion 131 and a part of the patterned metal composite layer 140 located on the pad portion 131. In the present embodiment, a material of the second patterned insulating layer 150 may include silicon oxide, silicon oxynitride, silicon nitride, an organic material, a polymer, or a combination thereof. The organic material is, for example, benzocyclobutene (BCB). The polymer is, for example, polyimide (PI). The second patterned insulating layer 150 may be formed by firstly using a chemical vapor deposition method or a coating method to form the insulating layer and then performing an exposure development to the insulating layer, but the invention is not limited thereto.

With the aforementioned manufacturing method, the re-distribution layer 130, which is difficult to be peeled off, as shown in FIG. 1A through FIG. 1C, can be manufactured, thereby providing a favorable structure stability. Certainly, the form of the re-distribution layer structure is not limited thereto; other forms of the re-distribution layer structure are described in the following. It is to be noted that, in the following embodiments, components that are same or similar to the ones in the previous embodiment are represented with the same or similar notations, and descriptions thereof will not be repeated.

Figure 2:
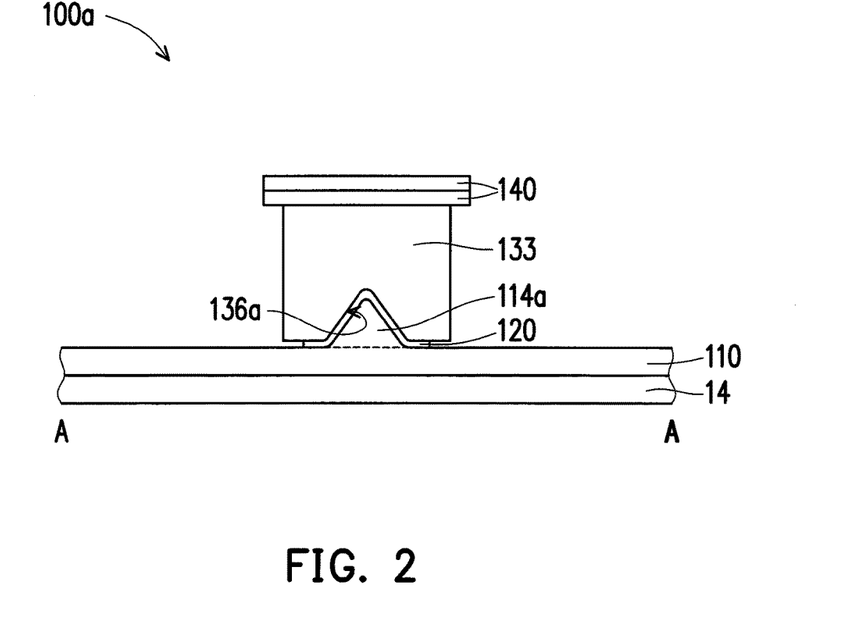
FIG. 2 to FIG. 3 are schematic cross-sectional views respectively illustrating a variety of re-distribution layer structures, each with a second patterned insulating layer hidden, according to other embodiments of the invention.
Figure 3:
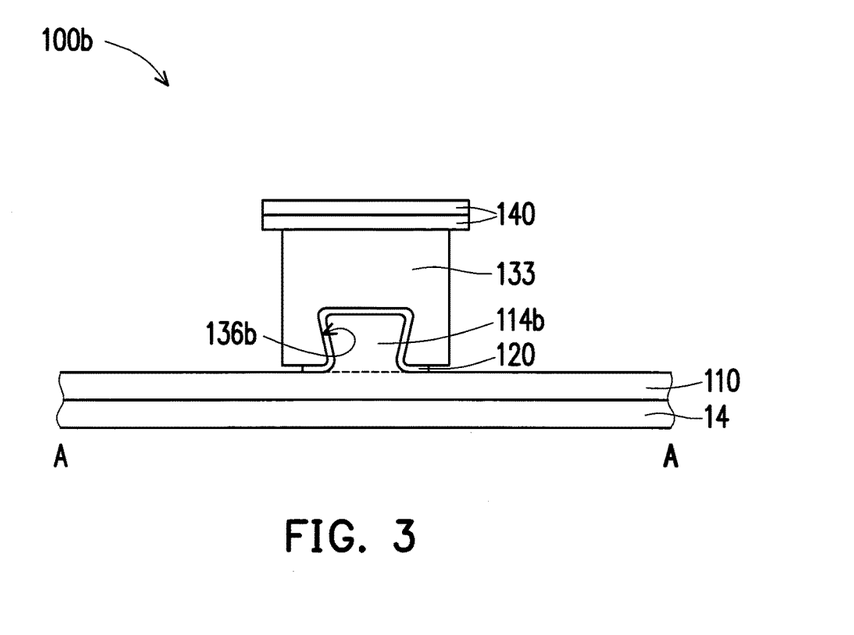

FIG. 2 to FIG. 3 are schematic cross-sectional views respectively illustrating a variety of re-distribution layer structures, each with a second patterned insulating layer hidden, according to other embodiments of the invention. Referring to FIG. 2, main differences between the re-distribution layer structure 100a of FIG. 2 and the re-distribution layer structure 100 of FIG. 1B lie in that, in FIG. 1B, a width of the protrusion 114b of the first patterned insulating layer 110 is, in principle, the same following a direction away from the protective layer 14 (namely, among different thicknesses), and a width of the trench 136 of the wire portion 132 of the re-distribution layer 130 is, in principle, the same following the direction away from the protective layer 14. That is to say, in FIG. 1B, the protrusion 114 basically appears to be in a shape of rectangular column.

In FIG. 2, a width of the protrusion 114a of the first patterned insulating layer 110 gradually shrinks following a direction away from the protective layer 14, and a width of the trench 136a of the body 133 of the wire portion 132 of the re-distribution layer 130 gradually shrinks following the direction away from the protective layer 14. That is to say, in FIG. 2, the protrusion 114a basically appears to be in a shape of triangular prism.

In the re-distribution layer structure 100b of FIG. 3, a width of the protrusion 114b of the first patterned insulating layer 110 gradually expands following a direction away from the protective layer 14, and a width of the trench 136b of the body 133 of the wire portion 132 of the re-distribution layer 130 gradually expands following the direction away from the protective layer 14. That is to say, in FIG. 3, the protrusion 114a basically appears to be in a shape of trapezoidal column. Certainly, the above merely describes several shapes of the protrusion 114, 114a, 114b as examples, and the shape of the protrusion is not limited thereto.

Figure 4A:
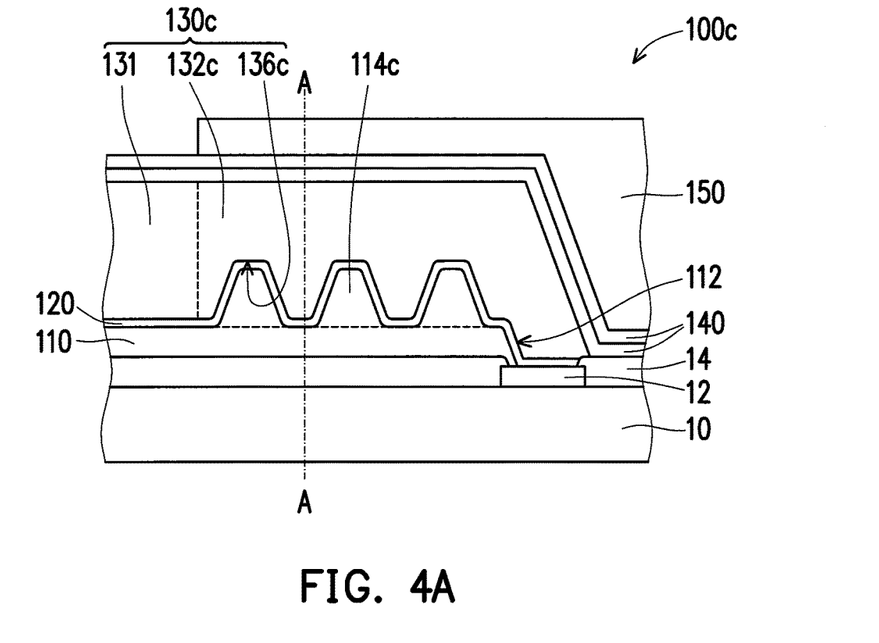
FIG. 4A is a schematic partial cross-sectional view illustrating a re-distribution layer structure according to an embedment of the invention.
Figure 4B:
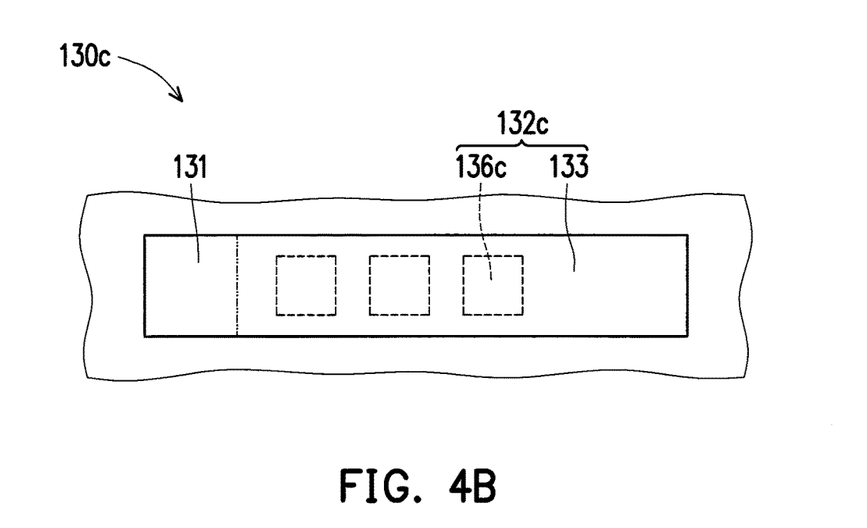
FIG. 4B is a schematic top view of a re-distribution layer of the re-distribution layer structure of FIG. 4A.

FIG. 4A is a schematic partial cross-sectional view illustrating a re-distribution layer structure according to an embedment of the invention. FIG. 4B is a schematic top view of a re-distribution layer of the re-distribution layer structure of FIG. 4A. Referring to FIG. 4A and FIG. 4B, main differences between the re-distribution layer structure 100c of the present embodiment and the re-distribution layer structure 100 of FIG. 1A lie in that, in the present embodiment, the first patterned insulating layer 110 includes a plurality of separated pile-shaped protrusions 114c, and the wire portion 132c of the re-distribution layer 130c includes a plurality of separated trench 136c. The number and positions of the protrusions 114c are corresponded to the number and positions of the trenches 136c. Certainly, the shapes and the numbers of the trenches 136c and the protrusions 114c are not limited to the drawings.

The re-distribution layer structure 100c of the present embodiment, through using the coordination between the protrusion 114c of the first patterned insulating layer 110 and the trench 136c of the wire portion 132c, increases an area for adhesion between the wire portion 132c and the first patterned insulating layer 110, and thus can also effectively lower a probability in which the wire portion 132c is peeled off from the first patterned insulating layer 110, thereby enabling the wire portion 132c of the re-distribution layer 130c to have a favorable structure stability on the substrate 10.

Figure 5:
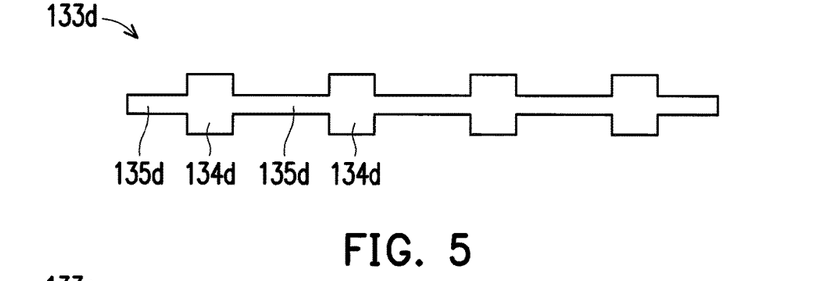
FIG. 5 to FIG. 8 are schematic top views respectively illustrating bodies of wire portions of a variety of re-distribution layer structures according to other embodiments of the invention.

FIG. 5 to FIG. 8 are schematic top views respectively illustrating bodies of wire portions of a variety of re-distribution layer structures according to other embodiments of the invention. Referring firstly to FIG. 5, a main difference between the body 133 of FIG. 1C and the body 133d of FIG. 5 lies in that, in FIG. 1C, the body 133 of the wire portion 132 appears to have an equal width along an extending direction of the wire portion 132 (left-right direction in the figure). In the present embodiment, the body 133d includes a plurality of enlarged regions 134d and a plurality of connection regions 135d, that are alternately connected, along the extending direction of the wire portion 132. Widths of the connection regions 135d can be approximately close to the width of the body 133 of the wire portion 132 of FIG. 1C, and widths of the enlarged regions 134d are respectively greater than the widths of the connection regions 135d.

In other words, in the present embodiment, since the body 133d has the enlarged regions 134d, there is a larger area for adhesion between the body 133d and the underlying first patterned insulating layer 110 (as illustrate in FIG. 1B); thus, a probability of which the wire portion is peeled off from the first patterned insulating layer 110 can be lowered. In FIG. 5, the enlarged regions 134d are in the shape of rectangles, but the shape of the enlarged regions 134d is not limited thereto.

Figure 6:
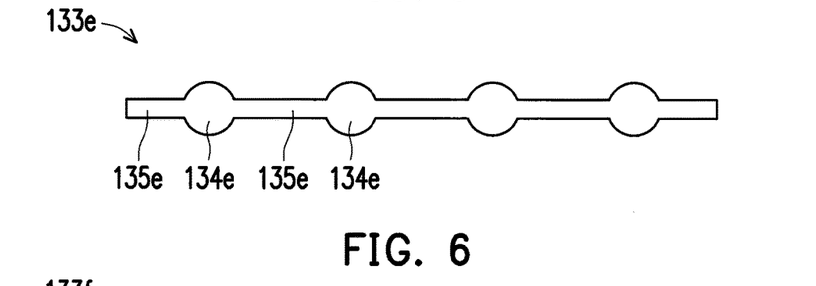
Figure 7:
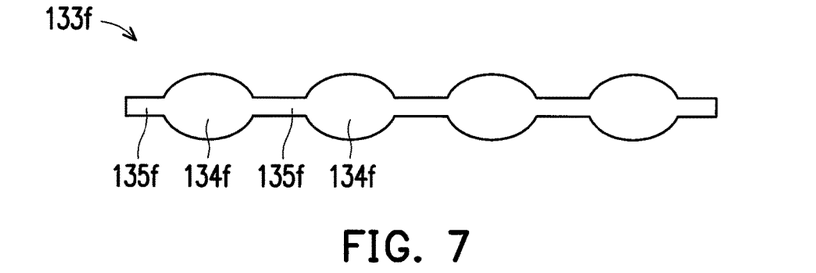
Figure 8:
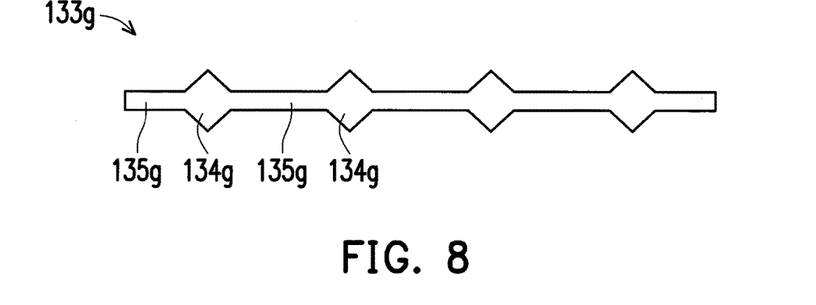

Referring to FIG. 6 through FIG. 8, main differences between the body 133e, 133f, 133g of FIG. 6 through FIG. 8 and the body 133d of FIG. 5 lie in that: in FIG. 6, the enlarged regions 134e are in the shape of circles; in FIG. 7, the enlarged regions 134f are in the shape of ovals; and in FIG. 8, the enlarged regions 134g are in the shape of diamonds. In other embodiments, the enlarged regions may also have irregular shapes, as long as a width of the enlarged regions is greater than a width of the connection regions, such that the shape of the enlarged regions is not limited to the above.

In addition, it is to be explained that, FIG. 5 to FIG. 8 merely illustrate the top viewed shapes of the body 133d, 133e, 133f, 133g of the wire portion schematically, and the trench in coordination with the body 133d, 133e, 133f, 133g may be a single strip-shaped trench 136 as show in FIG. 1C, a plurality of trench 136c as shown in FIG. 4B, or other form of trench, such that the body 133d, 133e, 133f, 133g can coordinate with different forms of the trench 36, 136c, respectively.

In other words, if using the re-distribution layer as shown in any of FIG. 5 to FIG. 8, since the body 133d, 133e, 133f, 133g of the wire portion, in addition to the connection regions 135d, 135e, 135f, 135g, further has the enlarged regions 134d, 133e, 133f, 133g of a greater width, other than extending the protrusion 114, 114c into the trench 136, 136c to increase an area for adhesion as described in the previous embodiment, the area for adhesion between the body 133d, 133e, 133f, 133g and the first patterned insulating layer is also increased, thereby enabling the wire portion of the re-distribution layer to have a favorable structure stability on the substrate.

Figure 9:
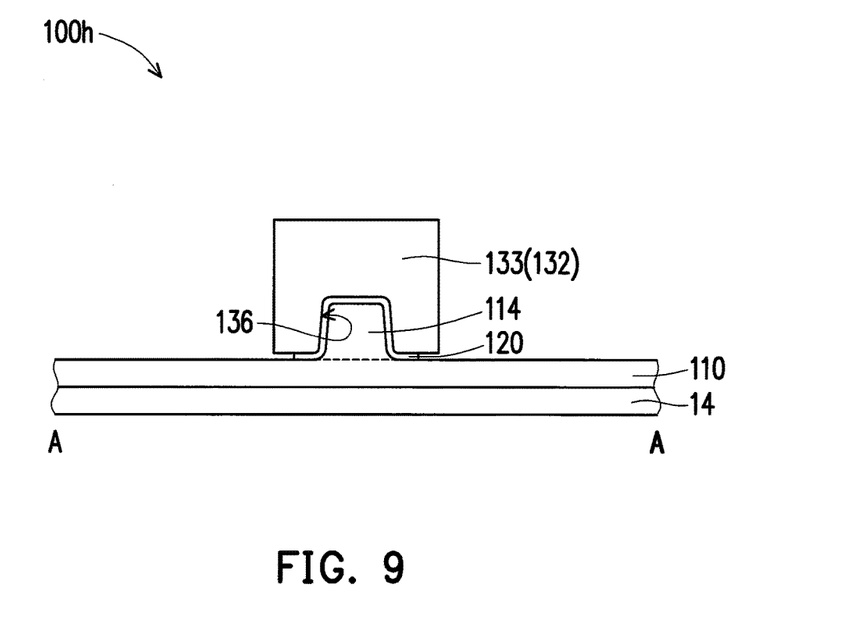
FIG. 9 is a schematic cross-sectional view illustrating a re-distribution layer structure, with a second patterned insulating layer hidden, according another embodiment of the invention.

FIG. 9 is a schematic cross-sectional view illustrating a re-distribution layer structure, with the second patterned insulating layer hidden, according to another embodiment of the invention. Referring to FIG. 9, a difference between FIG. 9 and FIG. 1B lies in that, in FIG. 1B, the patterned metal composite layer 140 is disposed on the re-distribution layer 130, that is, the re-distribution layer 130 and the patterned metal composite layer 140 are stack layers of Cu/Ni/Ag. In FIG. 9, the re-distribution layer structure 100h does not have a patterned metal composite layer 140 being disposed on the re-distribution layer 130, that is, in FIG. 9, only the copper body 133 is, for example, protruded onto the first patterned insulating layer 110.

In summary, the re-distribution layer structure of the invention, through configuring the first patterned insulating layer with the protrusion, enabling the wire portion of the re-distribution layer to include the body and the trench caved in the body, and effectively increasing the area for adhesion between the first patterned insulating layer and the wire portion of the re-distribution layer by extending the protrusion of the first patterned insulating layer into the trench of the wire portion so as to lower a probability of which the wiring portion of the re-distribution layer is peeled off from the first patterned insulating layer, enables the wire portion of the re-distribution layer to have a favorable structure stability on the substrate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A re-distribution layer structure, disposed on a substrate, the substrate having a pad and a protective layer, wherein the protective layer has a first opening, the first opening exposes a part of the pad, and the re-distribution layer structure comprises:
   a first patterned insulating layer, disposed on the protective layer and comprising a second opening and at least one protrusion, wherein the second opening is corresponded to the first opening so as to expose a part of the pad, and the at least one protrusion protrudes toward a direction away from the protective layer;
   a re-distribution layer, disposed on the first patterned insulating layer and comprising a pad portion and a wire portion, wherein the pad portion is located on the first patterned insulating layer, the wire portion comprises a body and at least one trench caved in the body, the wire portion is located on the first patterned insulating layer and extends from the pad portion into the first opening and the second opening so as to connect with the pad, the at least one protrusion extends into the at least one trench, and the body covers the at least one protrusion; and
   a second patterned insulating layer, disposed on the first patterned insulating layer, the second patterned insulating layer covering the wire portion and exposing a part of the pad portion.

2. The re-distribution layer structure as recited in the claim 1, wherein the at least one protrusion comprises a strip-shaped protrusion or a plurality of separated pile-shaped protrusions, and the at least one trench comprises a strip-shaped trench or a plurality of separated trenches.

3. The re-distribution layer structure as recited in the claim 1, wherein an inner profile shape of the at least one trench is corresponded to an outer profile shape of the protrusion, and the number and position of the at least one protrusion are corresponded to the number and position of the at least one trench.

4. The re-distribution layer structure as recited in the claim 1, wherein a width of the at least one protrusion gradually shrinks, gradually expands or remain unchanged following a direction away from the protective layer.

5. The re-distribution layer structure as recited in the claim 1, wherein a width of the at least one protrusion is smaller than a width of the body.

6. The re-distribution layer structure as recited in the claim 1, wherein the body of the wire portion comprises a plurality of enlarged regions and a plurality of connection regions, which are alternately connected, along an extending direction of the wire portion, widths of the enlarged regions are respectively greater than widths of the connection regions, and a shape of the enlarged regions comprises circle, oval, rectangle, diamond, or irregular shape.

7. The re-distribution layer structure as recited in the claim 1, further comprising:
   an under bump metallurgic (UBM) layer, disposed under the re-distribution layer, and located between the re-distribution layer and the first patterned insulating layer and between the re-distribution layer and the pad.

8. The re-distribution layer structure as recited in the claim 1, further comprising:

a patterned metal composite layer, disposed on the re-distribution layer, wherein a width of the patterned metal composite layer is greater than a width of the re-distribution layer.

9. A manufacturing method of re-distribution layer, comprising:

providing a substrate, wherein the substrate has a pad and a protective layer, the protective layer has a first opening, and the first opening exposes a part of the pad;

forming a first insulating layer on the protective layer;

performing twice a patterning procedure on the first insulating layer to form a first patterned insulating layer, wherein the first patterned insulating layer comprises a second opening and at least one protrusion, the second opening is corresponded to the first opening so as to expose a part of the pad, and the at least one protrusion protrudes toward a direction away from the protective layer;

forming a re-distribution layer on the first patterned insulating layer, wherein the re-distribution layer comprises a pad portion and a wire portion, the pad portion is located on the first patterned insulating layer, the wire portion comprises a body and at least one trench caved in the body, the wire portion is located on the first patterned insulating layer and extends from the pad portion into the first opening and the second opening so as to be connected with the pad, the at least one protrusion extends into the at least one trench, and the body covers the at least one protrusion; and forming a second patterned insulating layer on the first patterned insulating layer to cover the wire portion and a periphery of the pad portion, and the second patterned insulating layer exposing a part of the pad portion.

10. The manufacturing method of re-distribution layer structure as recited in claim 9, further comprising:

before forming the re-distribution layer, forming an UBM layer on the first patterned insulating layer, wherein the UBM layer covers the pad and a part of the first patterned insulating layer.

* * * * *